United States Patent [19]
Watanabe et al.

[11] Patent Number: 4,598,424
[45] Date of Patent: Jul. 1, 1986

[54] MICROWAVE MIXER CIRCUIT

[75] Inventors: Shigeru Watanabe, Tokyo; Naotaka Tomita, Kawasaki; Shigekazu Hori, Yokohama, all of Japan

[73] Assignee: Kabushiki Kaisha Toshiba, Kawasaki, Japan

[21] Appl. No.: 601,573

[22] Filed: Apr. 18, 1984

[30] Foreign Application Priority Data

Apr. 22, 1983 [JP] Japan .................. 58-70975

[51] Int. Cl.[4] .............................. H04B 1/26
[52] U.S. Cl. .................. 455/327; 455/330
[58] Field of Search ............... 455/325, 326, 327, 330

[56] References Cited
U.S. PATENT DOCUMENTS

| | | | |
|---|---|---|---|
| 3,327,220 | 6/1967 | Podell | 455/326 |
| 3,534,267 | 10/1970 | Hyltin | 455/327 |
| 3,943,450 | 3/1976 | Otremba | 455/330 |
| 4,193,048 | 3/1980 | Nyhus | 455/326 |

OTHER PUBLICATIONS

"Microwave Semiconductor Devices and Their Circuit Applications"—Watson (Editor) McGraw-Hill Book Company, New York 1969, Chapter 12, pp. 370–395.
"A 31 GHZ Monolithic GaAs Mixer/Preamplifier Circuit For Receiver Applications"—Chu et al., IEEE Trans. on Electron Devices, vol. Ed-28, No. 2, Feb. 1981, pp. 149–154.
"High Quality X-Band Monolithic Diode Mixer'"—Jacomb-Hood et al., IEEE 1983 Microwave and Millimeter-Wave Monolithic Circuits Symposium, Digest of Papers, pp. 1–4.

*Primary Examiner*—Marc E. Bookbinder
*Attorney, Agent, or Firm*—Cushman, Darby and Cushman

[57] ABSTRACT

In a microwave mixer circuit, two diodes connected in series are formed in a semi-insulating semiconductor substrate. A power distributing circuit is connected across the series circuit of the diodes. One of the connecting points is connected to a first signal terminal. A line connecting the two diodes in series is connected to the second signal input terminal and through a low-pass filter element to an intermediate frequency output terminal.

5 Claims, 10 Drawing Figures

4,598,424

MICROWAVE MIXER CIRCUIT

BACKGROUND OF THE INVENTION

The present invention relates to a monolithic microwave mixer circuit of the type in which diodes and a circuit are integrated onto a semiconductor insulating substrate.

A balanced type mixer using a couple of mixer diodes has been widely used in this field. This type of mixer can better separate a signal from a local oscillation signal, and suffers from little noise figure degradation due to the noise of the local oscillator.

The balanced type mixer requires a phase difference of 180° between the signal and the local oscillation signal at the two mixer diodes. To have such phase difference, the mixer is provided with a phase inverting circuit.

FIG. 1 is a schematic illustration of conventional balanced type microwave mixers using a rat-race ring-type power-distributing circuit. A rat-race ring-type power-distributing circuit 1 is provided with a ring-like electric path 1a with a circular length equal to 6/4 of a wavelength $\lambda_0$ of an input signal. The power distributing circuit is further provided with a terminal 4 of a mixer diode 3 distanced $\frac{3}{4}\lambda_0$ from a signal input terminal 2 as viewed counterclockwise. Additionally used is a terminal 6 of the mixer diode 5 distanced $\frac{1}{4}\lambda_0$ from the signal input terminal 32 as viewed clockwise. An input terminal 7 for a local oscillation signal is centered between the terminals 4 and 6 of the mixer diodes 3 and 5 with a distance of $\frac{1}{4}\lambda_0$ from each of those terminals 4 and 6.

The local oscillation signal input through the terminal 7 is applied to and reaches the two mixer diodes 3 and 5 in-phase. The signal input through the terminal 2 reaches the mixer diodes 3 and 5 at phases different from each other by 180°. The phase relationship of the applied signals enables the circuit to operate in a balanced mode. The mixer diode 5 is forwardly connected, while the diode 3 is reversely connected. The outputs of these diodes are connected together and to a low-pass filter 8. The output of the low-pass filter 8 is derived from an output terminal 9 for intermediate frequency.

FIG. 2 is a schematic illustration of the balanced type microwave mixer using branch-line coupler. This mixer employs a frame shaped line having a pair of parallel arranged lines 11 and 12 of $0.25\lambda_0$ long and a characteristic impedance $Z_0$, and another pair of lines 13 and 14 of $0.25\lambda_0$ long and a characteristic impedance $Z_0/\sqrt{2}$, which are arranged perpendicular to and connected to both ends to the pair of lines 11 and 12, as shown. The ends of the lines 13 and 14 are respectively used as a signal input terminal 15 and an oscillation signal input terminal 16. The other ends of those lines 13 and 14 are respectively used as a terminal 18 for a mixer diode 17 and a terminal 20 for a mixer diode 19. The mixer diode 17 is reversely connected between the terminal 18 and the low-pass filter 21. The mixer diode 19 is forwardly connected between the terminal 20 and the low-pass filter 21. The output of the low-pass filter 21 is derived from an intermediate frequency output terminal 22. In this branch-line coupler, four terminals may be branched from a loop, not four lines.

In the power distributing circuit based on the branch-line coupler, a signal input through the terminal 15 reaches the diode 19 with a delay of 90° after it reaches the diode 17. The signal input through the terminal 16 reaches the diode 17 delayed 90° after it reaches the diode 19. Accordingly, the intermediate frequency signals generated at the diodes 17 and 19 are at phases different from each other by 180°, and thus operate as a balanced type microwave mixer.

Since both the circuits of FIGS. 1 and 2 use distributed circuits in the power distributing circuit, the entire length of the lines is long; $3/2\lambda_0$ for the rat-race ring-type circuit and $\lambda_0$ for the branch-line coupler circuit. This makes the circuit large in size as a whole. Particularly in a monolithic microwave integrated circuit in which diodes, a power distributing circuit, and an impedance matching circuit are integrated onto a semiconductor substrate made of GaAs (gallium arsenide), the cost reduction requirement demands the smallest possible pattern and chip. In spite of such a demand, the conventional balanced type mixer inherently has a large chip and is costly.

SUMMARY OF THE INVENTION

Accordingly, an object of the present invention is to provide a monolithic microwave mixer circuit which is small and inexpensive, suitable in fabrication for a monolithic microwave integrated circuit, and allows the manufacturing of the mixer circuits on a mass production basis.

According to the present invention, there is provided a monolithic microwave mixer circuit remarkably reduced in size and in cost, and suitable for a mass production.

DETAILED DESCRIPTION OF THE PREFERRED EMBODIMENTS

Figure 1:
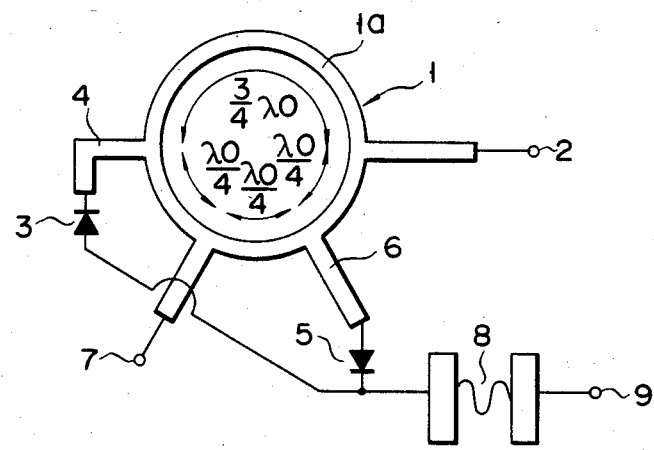
FIG. 1 is a plan view of a conventional balanced type microwave mixer using rat-race rings.
Figure 2:
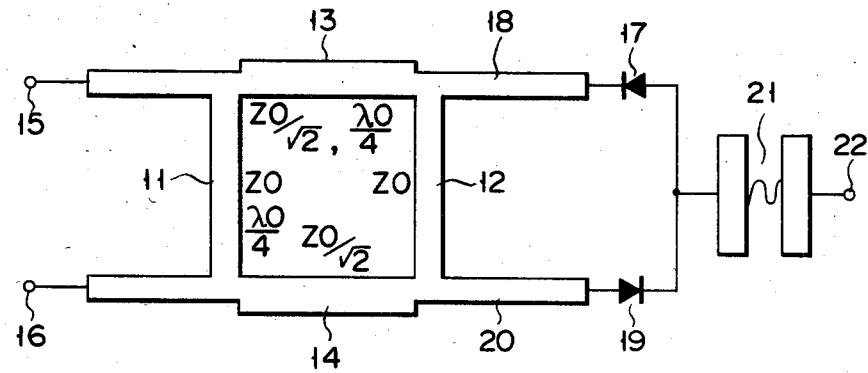
FIG. 2 is a plan view illustrating a conventional balanced type microwave mixer using branch-line coupler.
Figure 3:
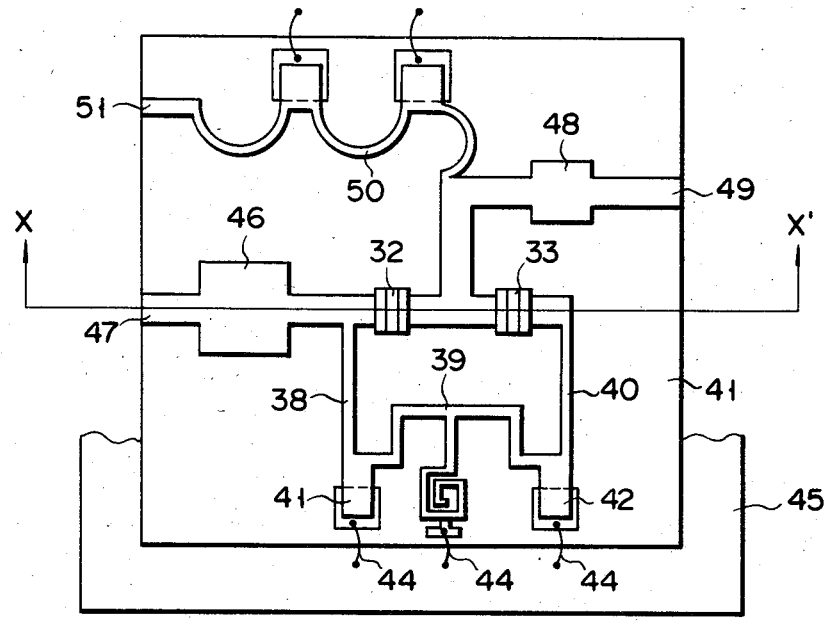
FIG. 3 is a plan view illustrating an embodiment of a microwave mixer circuit according to the present invention.
Figure 4:
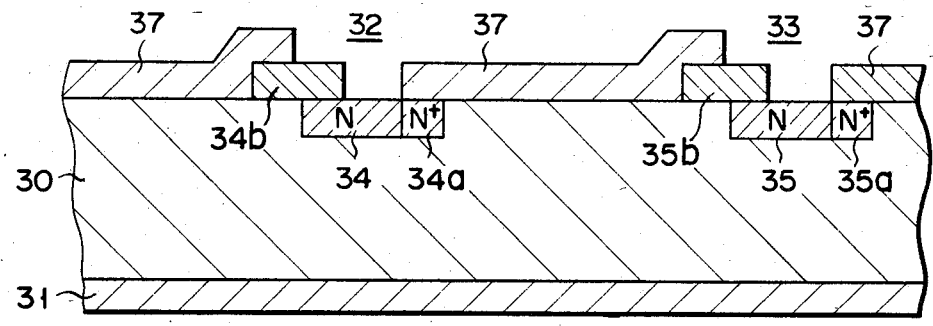
FIG. 4 illustrates a cross sectional view taken on line X—X' in FIG. 3.

An embodiment of a microwave mixer circuit according to the present invention will be described referring to the accompanying drawings. In FIGS. 3 and 4, illustrating an embodiment of the present invention, an grounding conductor 31 is formed on the entire surface on the reverse surface of a semiconductor substrate 30 made of semi-insulating material such as GaAs (Gallium Arsenide), InP (Indium Phosphide), InAsP (Indium Arsenide Phosphide), and GaP (Gallium Phosphide). A couple of mixer diode elements 32 and 33 are formed on the surface of the semiconductor substrate 30. Those diode elements 32 and 33 have the same structures. In fabricating those elements, N layers 34 and 35 are formed in the surface region of the semiconductor substrate 30 by the ion implantation process. Then, ions are implanted into the end parts of the N layers 34 and 35, thereby forming N+ layers 34a and 35a therein. The N layers 34 and 35 are respectively led out to the exterior by Schottky barrier metal such as aluminum electrodes 34b and 35b deposited on the surface of the semiconductor substrate 30. The conductive films 37 for ohmic contact to N+ layer and interconnection are also formed on the surface of semiconductive substrate 30. The result of the process steps is the formation of diodes with Schottky junctions between the layers 34 and 35 and the aluminum electrode 34b and 35b. Both the diode elements 32 and 33 may be formed in the same process steps, and hence their electric characteristics may be made substantially equal to each other. Those mixer diodes 32 and 33 are connected in series by conductive films 37. Connected across the series circuit of the diodes 32 and 33 is a T-type or $\pi$-type phase inverting circuit made up of three reactance elements 38-40 of high impedance lines and capacitance elements 41 and 42 of the metal-insulator-metal structure. A return circuit 43 for a signal current for intermediate frequency is connected to the reactance element 39. The capacitance elements 41 and 42 and the return circuit 43 are connected at their electrodes to the grounding frame 45, disposed around the semiconductor substrate 30, through bonding wires 44. Alternately, those elements and the return circuit may be connected to the grounding conductor 31 on the reverse side by the through-hole technique. Between the mixer diode 32 and the reactance element 38, a first high frequency input terminal element, for example, the signal input terminal 47, is connected through an impedance matching circuit 46. An interjunction between the mixer diodes 32 and 33, which are connected in series, is routed through another impedance matching circuit 48 to a second high frequency input terminal element, for example, a local oscillation input terminal 49. The same junction is further routed to an intermediate frequency output terminal element 51, being interposed therebetween with a low-pass filter element allowing an intermediate frequency signal to pass therethrough. The impedance matching circuits 46 and 48 are realized by partially expanding the width of the lines.

Figure 5:
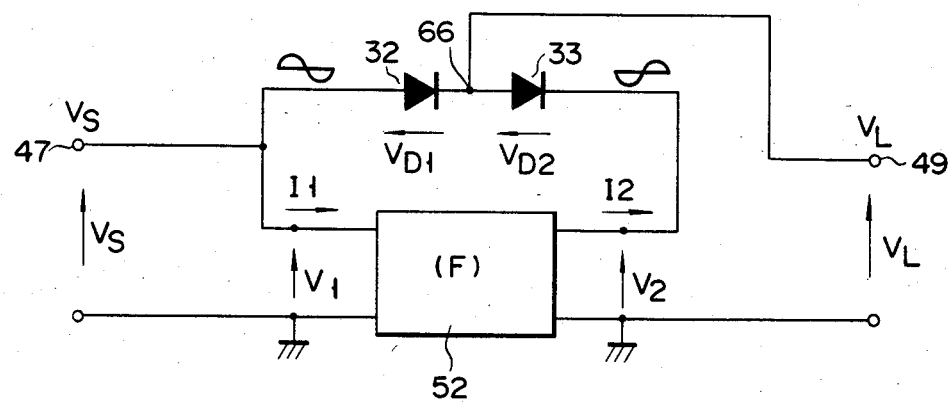
FIG. 5 is a circuit diagram useful in explaining the operation of a balanced type microwave mixer shown in FIGS. 3 and 4.

The operation of the balanced type microwave mixer will be described referring to FIGS. 5-7. In FIG. 5, a signal $V_S$ is applied to the signal input terminal 47, while a local oscillation signal $V_L$ is applied to the input terminal 49 for the local oscillation signal input. In this case, to ensure the function of the balanced type microwave mixer, the condition as given by a matrix expression below must hold in the power distributing circuit 52:

$$\begin{pmatrix} V_1 \\ I_1 \end{pmatrix} = \begin{pmatrix} -1 & 0 \\ 0 & -1 \end{pmatrix} \begin{pmatrix} V_2 \\ I_2 \end{pmatrix} \tag{1}$$

From the above matrix expression, we know that when the signal $V_S$ is applied to the input terminal 47, the signal travels toward and reaches the mixer diodes 32 and 33, and the signal voltages $V_{D1}$ and $V_{D2}$ appear at these diodes are given by:

$$V_{D1} = V_{D2} = V_S \tag{2}$$

The equation (2) indicates that the signal $V_S$ travels toward and reaches the two diodes 32 and 33 in phase. Further, from the matrix (1) we see that the local oscillation signal $V_L$ applied to the terminal 49 has the following relation when it reaches the mixer diodes 32 and 33:

$$V_{D2} = -V_{D1} = V_L \tag{3}$$

The relation (3) teaches that the signals $V_{D1}$ and $V_{D2}$ at the mixer diodes are exactly opposite phase to each other. Consequently, if the power distributing circuit 52 satisfies the matrix (1), it operates as a balanced type microwave mixer.

Figure 6A:
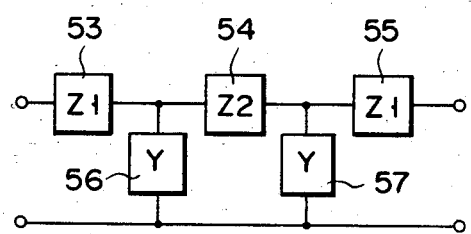
FIGS. 6(a) and 6(b) show respectively equivalent T-type circuits and $\pi$-power distributing circuits which are used in the present invention.

Functionally shown in FIG. 6(a) is a phase inverting circuit which is applicable for the power distributing circuit 52. The phase inverting circuit consists of three series-connected circuit elements 53 ($Z_1$), 54 ($Z_3$) and 55 ($Z_1$) and two parallel-connected circuit elements 56 (Y) and 57 (Y), which are arranged as shown. In the circuit, we have the following relation derived from the equation (1):

$$YZ_1 = -1, \; Z_2 = 2Z_1 \tag{4}$$

Practically, if capacitors C are used for the parallel-connected circuit elements 56 and 57 and inductors $L_1$ and $L_2$, for the series-connected circuit elements 53, 55, and 54, from the equation (4) we have:

$$\omega^2 L_1 C = 1, \; L_2 = 2L_1 \tag{5}$$

where $\omega$ is an angular frequency. In designing this phase inverting circuit, actual circuit constants C, $L_1$, and $L_2$ are determined according to the equations (5).

Figure 6B:
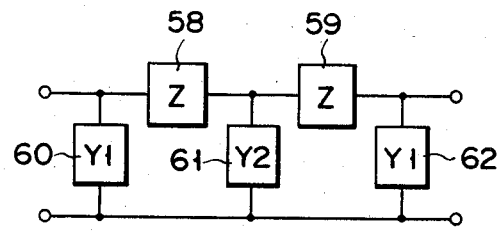

Another functional arrangement of the phase inverting circuit is shown in FIG. 6(b). Arranged as shown, the phase inverting circuit consists of two series-connected circuit elements and three parallel-connected circuit elements 60 ($Y_1$), 61 ($Y_2$), and 62 ($Y_3$). In this arrangement of the phase inverting circuit, the following relations (6) are derived from the matrix (1).

$$Y_1 Z = -1, \; Y_2 = 2Y_1 \tag{6}$$

Spiral, meander lines and high impedance lines may be used for inductors to be formed on the semi-insulating semiconductor substrate. Further, a metal-insulator-metal structure and an inter-digital structure may be used for the capacitors.

Figure 7A:
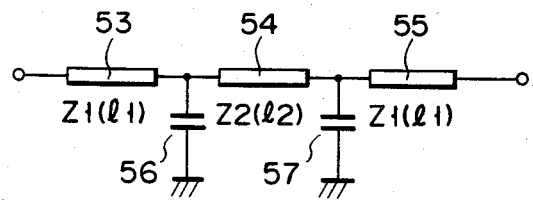
FIGS. 7(a) and 7(b) are T-type circuit diagrams and $\pi$-type power distributing circuits used in the present invention.

A T-type phase inverting circuit using high impedance lines for the inductors is shown in FIG. 7(a). As shown, high impedance lines of $l_1$ and $l_2$ long are used for the series-connected circuit elements 53, 55, and 54. Capacitors C are used for the parallel-connected circuit elements 56 and 57.

Figure 8:
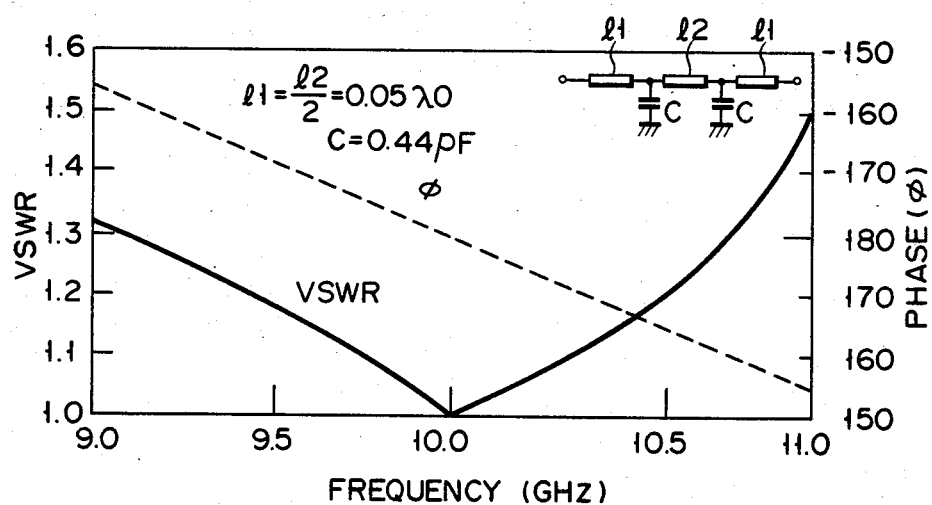
FIG. 8 is a graphical representation showing the calculation results of a frequency response of the power distributing circuit according to the present invention.

Characteristic curves of the phase inverting circuit thus structured were plotted as shown in FIG. 8 under the conditions: the center frequency is 10 GHz, the lengths of the high impedance lines $l_1$ and $l_2$ are respectively 0.05$\lambda_0$ and 0.1$\lambda_0$, and the capacitance of the capacitor C is 0.44 pF. As shown, VSWR (the voltage standing-wave ratio) is 1.0 at the center freqency $f_0$ and the phase $\phi = 180°$. The entire length L of the lines ($L = l_1 + l_2 + l_3$) is 0.2$\lambda_0$, much shorter than that of the conventional rat-race ring type or the branch-line couplers type power distributing circuit.

The balanced type microwave mixer shown in FIG. 3 employs a phase inverting circuit arranged as shown in FIG. 7(a). The reactance elements 38, 39, and 40 are inductors of high impedance lines. The capacitors 41 and 42 are capacitance elements of the metal-insulator-metal structure. Therefore, the entire phase inverting circuit is remarkably reduced in size.

Figure 7B:
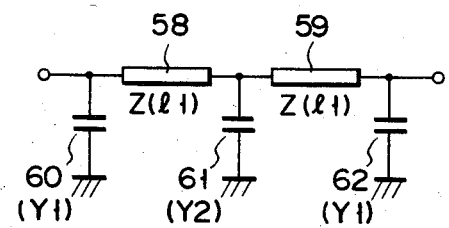

Of course, the π-type phase inverting circuit as shown in FIG. 6(b) may be used for the balanced type microwave mixer as shown in FIG. 3. In this case, the practical circuit arrangement is as shown in FIG. 7(b). Specifically, high impedance lines of the length $l_1$ are used for the series-connected circuit elements 58 and 59. Capacitors C1 and C2 are used for the parallel-connected circuit elements 60, 62, and 61.

The embodiment shown in FIG. 3 uses the metal-insulator-metal structure for capacitors and high impedance lines for inductors, as described above. Alternately, the inter-digital type capacitor, and spiral or meander lines may be used for those reactance elements. Also, in this case, useful effects comparable with those in the above-mentioned embodiment may be attained.

What is claimed is:

1. A microwave mixer circuit comprising:
   a semi-insulating semiconductor substrate;
   two diodes formed on said semiconductor substrate and connected in series with a node being formed therebetween;
   a phase inverting circuit including:
   (a) a plurality of series connected inductive elements connected to one another at nodes therebetween, thereby forming a string of inductive elements with no non-inductive elements separating any inductive elements, said string connected in parallel across said two series connected diodes, and
   (b) at least one capacitive element connected to a node between any two of said inductive elements, for inverting the phase of an input signal;
   a first high frequency signal input terminal coupled to one of said diodes and to one end of said phase inverting circuit;
   a second high frequency input terminal connected to the node between said two diodes;
   a low-pass filter element having an input terminal and an output terminal, said input terminal being connected to one of said first and second high frequency signal input terminals; and
   an intermediate frequency output terminal directly connected to said output terminal of said low-pass filter element.

2. The microwave mixer circuit according to claim 1, in which said inductance and capacitance elements, said diodes, said low-pass filter element, said first and second high frequency signal input terminals and said intermediate frequency output terminal are interconnected through microstrip lines formed on said semiconductor substrate.

3. The microwave mixer circuit according to claim 1, in which said semi-insulating semiconductor substrate is made of Gallium-Arsenide.

4. The microwave mixer circuit according to claim 2 further comprising two impedance matching circuits, a first impedance matching circuit provided between said first high frequency signal input terminal and an associated microstrip line and a second impedance matching circuit provided between said second high frequency signal input terminal and another associated microstrip line.

5. The microwave mixer circuit according to claim 4, in which both of said impedance matching circuits comprise line elements of widths greater than microstrip lines to which they are coupled.

* * * * *